United States Patent [19]
Herchen

[11] Patent Number: 5,737,178
[45] Date of Patent: Apr. 7, 1998

US005737178A

[54] MONOCRYSTALLINE CERAMIC COATING HAVING INTEGRAL BONDING INTERCONNECTS FOR ELECTROSTATIC CHUCKS

[75] Inventor: Harald Herchen, San Jose, Calif.

[73] Assignee: Applied Materials, Inc., Santa Clara, Calif.

[21] Appl. No.: 812,194

[22] Filed: Mar. 6, 1997

[51] Int. Cl.⁶ .................................................. H02N 13/00
[52] U.S. Cl. ...................................... 361/234; 118/401
[58] Field of Search .......................... 361/233, 234; 279/128; 117/23, 54, 950; 427/420; 118/667, 401, 429, 500; 501/86

[56] References Cited

U.S. PATENT DOCUMENTS

| | | |
|---|---|---|
| 3,701,636 | 10/1972 | LaBelle, Jr. et al. ............ 23/301 SP |
| 3,915,662 | 10/1975 | LaBelle, Jr. et al. ............ 23/301 SP |
| 4,184,188 | 1/1980 | Briglia ................................ 361/234 |
| 4,384,918 | 5/1983 | Abe ..................................... 156/643 |
| 4,399,016 | 8/1983 | Tsukada et al. ................. 204/192 R |
| 4,480,284 | 10/1984 | Tojo et al. ........................ 361/234 |
| 4,502,094 | 2/1985 | Lewin et al. ...................... 361/234 |
| 4,565,600 | 1/1986 | Ricard ................................ 117/23 |
| 5,413,360 | 5/1995 | Atari et al. ....................... 279/128 |
| 5,455,062 | 10/1995 | Muhlfriedal et al. ............ 118/401 |
| 5,535,090 | 7/1996 | Sherman .......................... 361/234 |
| 5,654,041 | 8/1997 | Appich et al. .................... 118/401 |

OTHER PUBLICATIONS

H.E. LaBelle, Jr., "EFG, the Invention and Application to Sapphire Growth"; pp. 8–17 published by Saphikon, Inc.; received in final form 30 Oct. 1979.

*Primary Examiner*—Fritz Fleming
*Attorney, Agent, or Firm*—Ashok K. Janah; James C. Wilson; Peter J. Sgarbossa

[57] ABSTRACT

An electrostatic chuck (20) comprises at least one mesh electrode (30) on an underlying dielectric layer (25), the mesh electrode having apertures therethrough. A monocrystalline ceramic (28) covers the mesh electrode (30). The monocrystalline ceramic (28) comprises a layer of large crystals substantially oriented to one another, the layer of crystals having a resistivity sufficiently high to electrically insulate the mesh electrode (30). The monocrystalline ceramic (28) further comprises integral bonding interconnects (40) that form a unitary structure with the layer of large crystals, the bonding interconnects extending through the apertures in the mesh electrode (30) to bond directly to the underlying dielectric layer (25), substantially without adhesive.

58 Claims, 4 Drawing Sheets

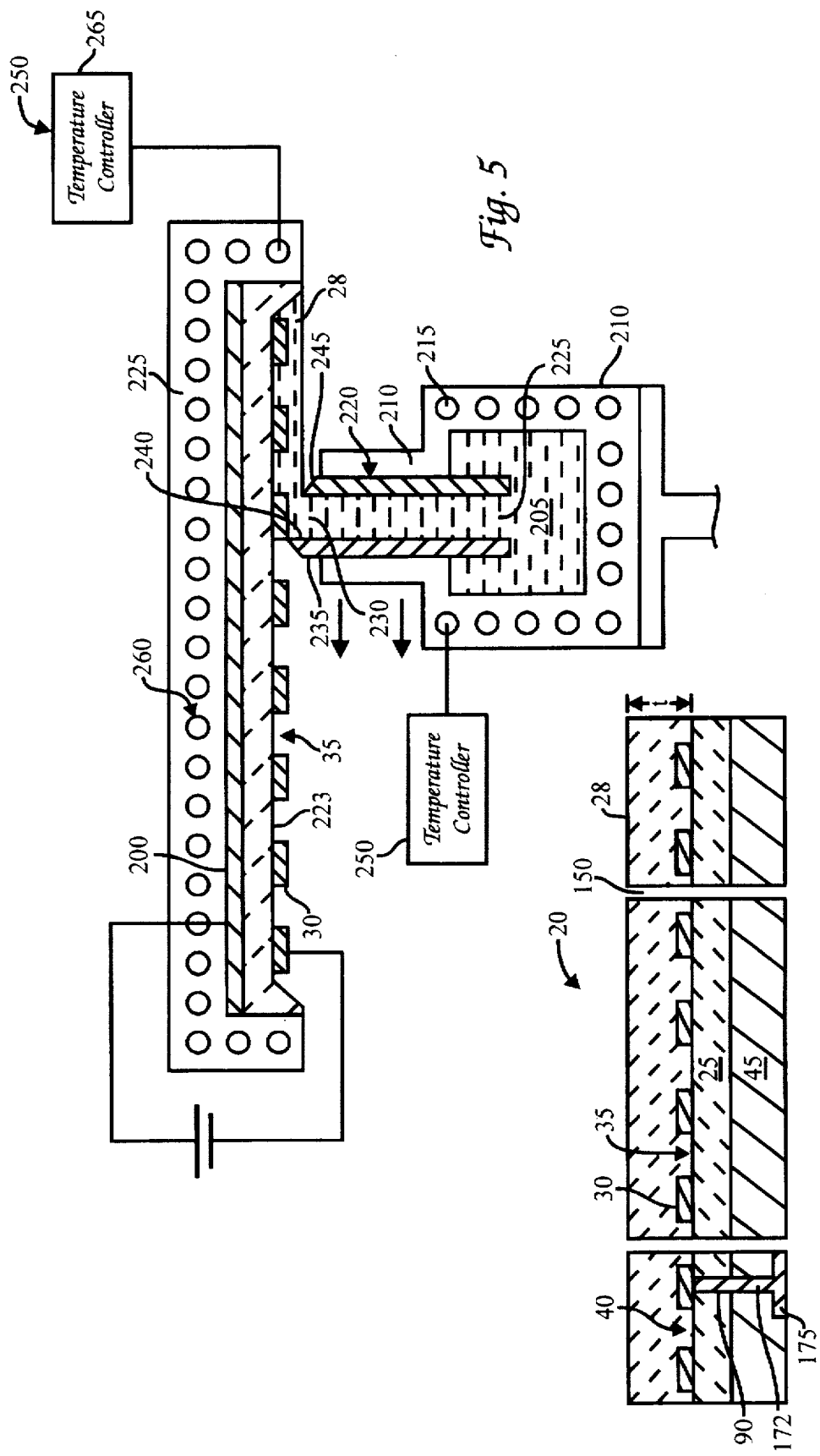

MONOCRYSTALLINE CERAMIC COATING HAVING INTEGRAL BONDING INTERCONNECTS FOR ELECTROSTATIC CHUCKS

BACKGROUND

The present invention relates to an electrostatic chuck useful for holding substrates, and particularly useful for holding semiconductor substrates in a plasma environment.

Electrostatic chucks are used to hold substrates in various applications, including for example, holding a sheet of paper in a computer plotter during printing or drawing on the paper, and holding a silicon wafer in a process chamber during semiconductor fabrication. A typical electrostatic chuck comprises an electrode covered by a dielectric layer. When the electrode of the chuck is electrically biased with respect to the substrate by a voltage, an attractive electrostatic force is generated that holds the substrate to the chuck. A bipolar electrode chuck comprises bipolar electrodes that are electrically biased relative to one another to provide the electrostatic attractive force. In monopolar electrode chucks, an electrically charged plasma formed from process gas introduced into a process chamber induces electrostatic charge in the substrate that electrostatically holds the substrate to the charged monopolar electrode chuck.

With reference to FIGS. 1a and 1b, the electrostatic attractive force generated by electrostatic chucks 10a, 10b, can be of different types. As schematically illustrated in FIG. 1a, a dielectric layer 11 with a high electrical resistance results in the generation of coulombic electrostatic forces from the accumulation of electrostatic charge in the substrate 12 and in the electrode 13 of the chuck 10a. The coulombic electrostatic force is described by the equation:

$$F = \frac{1}{2} \epsilon_0 \epsilon_r \left(\frac{V}{t}\right)^2 A$$

where $\epsilon_o$ and $\epsilon_r$ are the dielectric constant of vacuum and relative dielectric constant of the dielectric layer 11 respectively, V is the voltage applied to the electrode 13, A is the area of the electrode, and t is the thickness of the dielectric layer. The electrostatic force increases with increased dielectric constant $\epsilon_r$ of the dielectric layer 11.

With reference to FIG. 1b, Johnsen-Rahbek electrostatic attraction forces occur when an interface 14 of a low resistance dielectric layer 15 and the substrate 12, has an interfacial contact resistance much greater than the resistance of the dielectric layer 15, i.e., when the resistance of the dielectric layer 15 is typically from about $10^{11}$ to about $10^{14}$ Ωcm. In these chucks, free electrostatic charge drifts through the dielectric layer 15 under the influence of the electric field, and accumulate at the interface of the dielectric layer 15 and the substrate 12, as schematically illustrated in FIG. 1b. The charge accumulated at the interface generates a potential drop represented by the equation:

$$F = \frac{1}{2} \epsilon_0 \left(\frac{V}{\delta}\right)^2 A$$

where δ denotes the contact resistance of the air gap 14 between the substrate 12 and the low resistance dielectric layer 15. The Johnsen-Rahbek electrostatic attractive force is typically higher than that provided by coulombic forces, because polarization in the dielectric layer 15, and free charges accumulated at the interface 14 combine to enhance electrostatic force. Johnsen-Rahbek-type electrostatic chucks provide a strong electrostatic force that securely clamps the substrate 12 onto the chuck to improve thermal transfer rates, and the lower voltages used in these chucks reduces charge-up damage to active devices on the substrate 12.

In both types of chuck, the dielectric layer covering the electrode of the chuck commonly comprises a polymer or ceramic layer. For example, thin polymer layers, such as polyimide, can be adhered to the electrode and to one another using an adhesive, to form the chuck, as disclosed in U.S. Pat. No. 08/381,786, entitled "Electrostatic Chuck with Conformal Insulator Film," filed on Jan. 31, 1995, to Shamouilian, et al., which is incorporated herein by reference. However, the substrate held on the chuck can break or chip to form fragments having sharp edges that puncture the polymer film and expose the electrode of the chuck. Exposure of the electrode at even a single pinhole in the dielectric layer can cause arcing between the electrode and plasma, and require replacement of the entire chuck. Polymers also have a limited lifetime in erosive process environments, such as processes using oxygen-containing gases and plasmas. Also, polymers and the adhesive used to bond the polymer layers, cannot provide sustained operation at elevated temperatures exceeding about 1000° C.

It is also known to use polycrystalline ceramic layers to form the dielectric layer covering the electrode to provide increased puncture resistance and high temperature performance, as for example, described in U.S. Pat. No. 5,280,156 to Niori, Watanabe, et al., in "Relationship between Electrical Resistivity and Electrostatic Force of Alumina Electrostatic Chuck," Jpn. J. Appl. Phys., Vol. 32, Part 1, No. 2, (1993); and "Resistivity and Microstructure of Alumina Ceramics Added with $TiO_2$ Fired in Reducing Atmosphere," J. of the Am. Cer. Soc. of Japan Intl. Ed., Vol. 101, No. 10, pp. 1107–1114 (Jul. 1993); all of which are incorporated herein by reference. The ceramic dielectric layers are typically formed by plasma or flame spraying a ceramic powder, such as $Al_2O_3$, $TiO_2$, or $BaTiO_3$, as disclosed in U.S. Pat. 4,480,284. The polycrystalline ceramic layer comprise small grains or crystals having a diameter of 0.1 to 50 microns, with grain boundaries containing a mixture of glassy materials that hold the grains together. When such ceramic layers are exposed to erosive gaseous environments, such as fluorine containing plasmas, the plasma etches away the grain boundary regions causing the ceramic grains to loosen and flake off during processing of the substrate. Also, abrasion of the substrate against the chuck during manipulation of the substrate on the chuck, pushes and lifts up edges of the ceramic grains causing the grains to flake off the chuck. The loose ceramic grains contaminate the substrate and process chamber reducing the valuable yields of integrated circuit chips from the substrate.

Monocrystalline ceramic dielectric layers, such as sapphire layers, have relatively few, large, oriented crystals, and reduce the problems associated with polycrystalline ceramic layers. However, it is difficult to form a monocrystalline ceramic layer on a conductive metal electrode. In the Czochralski-type method, large crystals of silicon dioxide or alumina are drawn from a molten ceramic material using a seed crystal mounted on a die. The drawn out material cools and solidifies to form a column of large and oriented crystals. Thereafter, the column is sliced to form wafers of single alumina or silica material. However, such wafers are difficult to join together around a metal electrode. Also, Czochralski methods have crystal size limitations that prevent their use for the relatively large chuck diameters. Also, the crystals grown by such methods often have some small grains and can include facet defects.

In another monocrystalline ceramic forming process, commonly known as the EFG process (edge-defined, film fed, growth process) taught for example, in U.S. Pat. No. 3,701,636 and 3,915,662 to La Bella, et al., both of which are incorporated herein by reference, a monocrystalline ceramic filament is drawn from molten ceramic, using a die such as an annular ring contacting the molten ceramic material in a capillary tube. The molten ceramic material rises in the tube through capillary forces, and the die provides a seeding surface from which a continuous long filament of ceramic is drawn out. However, the size of the crystal that can be grown is limited by the edge of the die which restricts the dimensions of the growing crystal to sizes smaller than that needed to form a ceramic dielectric layer on a chuck. Also, the drawn out filament can twist and turn during the drawing out process to provide a disoriented and faceted crystalline structure.

It is also difficult to join or bond the cut wafers of monocrystalline ceramic to one another or to an electrode. For example, U.S. Pat. No. 5,413,360 to Atari, et al. (Kyocera) filed Dec. 1, 1993, describes an electrostatic chuck having a dielectric ceramic coating covering an electrode. In one version, the ceramic coating comprises single crystal sapphire which provides less contamination of substrates held on the chuck. The patent teaches that either a bonding agent, or a high temperature joining method, is used to join the single crystal layers around the electrode of the chuck. The high temperature joining method is described as direct contact and fusion of one or more mirror-ground single-crystalline sapphire materials under pressure at a high temperature. The patent further describes the electrode in the chuck as comprising palladium, platinum, nickel, and other mixtures. In another example, U.S. Pat. No. 5,535,090 to Sherman, filed Mar. 3, 1994, discloses an electrostatic chuck comprising sapphire dielectric sheets joined by brazing in a single step, high temperature vacuum braze using a suitable active braze alloy to etch sapphire to niobium. Another approach is to use commercially available platinum paste which is bonded onto a platinum layer sputtered onto the sapphire parts to promote adhesion. During such bonding processes, or afterward during use of the chuck in an erosive process environment, the joining material thermally or chemically degrades causing failure of the chuck and/or movement or misalignment of the substrate during processing. Also, the monocrystalline ceramic wafers often separates from the electrode at high temperatures due to the thermal expansion coefficient mismatch of the wafers and electrode.

Thus, it is desirable to have a chuck having a ceramic dielectric layer that exhibits reduced erosion and particle generation during processing of substrates. It is also desirable for the electrostatic chuck to provide stable and reliable electrical properties at high operating temperatures. There is also a need for an electrostatic chuck that is capable of sustained operation at elevated temperatures, preferably exceeding about 1000° C. It is further desirable to have a process for forming uniform, highly oriented, substantially monocrystalline ceramic layers.

SUMMARY

An electrostatic chuck fabricated by the present invention comprises a ceramic dielectric layer that exhibits reduced erosion and particle generation, and provides stable and reliable electrical properties at high operating temperatures. The electrostatic chuck comprises at least one mesh electrode on an underlying dielectric layer, the mesh electrode having apertures therethrough. A monocrystalline ceramic covers the mesh electrode. The monocrystalline ceramic comprises large crystals substantially oriented to one another, the crystals having a resistivity sufficiently high to electrically insulate the mesh electrode. The monocrystalline ceramic further comprises integral bonding interconnects that form a unitary structure with the layer of large crystals, the bonding interconnects extending through the apertures in the mesh electrode to bond directly to the underlying dielectric layer.

Preferably, the apertures in the mesh electrode are sized (i) sufficiently small to allow the mesh electrode to generate a uniform electrostatic field for holding the substrate upon application of a voltage to the electrode, and (ii) sufficiently large to allow the bonding interconnects formed therein to securely bond the monocrystalline ceramic layer to the underlying dielectric layer. The monocrystalline ceramic layer can comprise $Al_2$, BeO, $SiO_2$, $Ta_2O_5$, $ZrO_2$, CaO, MgO, $TiO_2$, $BaTiO_3$, AlN, TiN, BN, $Si_3N_4$, $ZrB_2$, $TiB_2$, $VB_2$, $W_2B_3$, $LaB_6$, $MoSi_2$, $WSi_x$, or $TiSi_x$. Preferably, the monocrystalline ceramic and the underlying dielectric layer comprises sapphire, and the electrode comprises a refractory metal having a melting point of at least about 2200° C.

In another embodiment, the electrostatic chuck comprises a first monocrystalline ceramic layer comprising at least one mesh electrode thereon, the mesh electrode having apertures therethrough. A second monocrystalline ceramic layer covers the mesh electrode, the second monocrystalline ceramic layer comprising integral bonding interconnects that extend through the apertures in the mesh electrode to bond directly to the first monocrystalline ceramic layer. The first and second monocrystalline ceramic layers comprise large crystals substantially oriented to one another, the crystals having a resistivity sufficiently high to electrically insulate the mesh electrode. Preferably, the electrode comprises a pattern of lattice defects induced in the first monocrystalline ceramic layer, or a pattern of dopant in the first monocrystalline ceramic layer.

The invention further comprises a method of forming a monocrystalline ceramic layer on a workpiece surface. In the method, a ceramic material is melted in a melt reservoir to form a molten ceramic. A capillary tube is positioned in the melt reservoir, the capillary tube comprising: (i) an inlet in the molten ceramic of the melt reservoir, and (ii) an outlet adjacent to the workpiece surface, the outlet comprising (1) a leading edge having a first height and a seeding surface, and (2) a trailing edge having a second height smaller than the first height. The outlet of the capillary tube is moved across a workpiece surface in a direction such that leading edge of the capillary tube moves ahead of the trailing edge, to deposit on the workpiece surface, a molten ceramic layer (i) drawn through the capillary tube, (ii) seeded by the seeding surface of the leading edge, and (iii) having a thickness t substantially controlled by the difference in first and second heights. Upon cooling the seeded molten ceramic layer forms a monocrystalline ceramic layer comprising large crystals substantially oriented to one another. The method is particularly useful for fabricating an erosion resistant electrostatic chuck in which an exposed surface of a mesh electrode on a dielectric layer and apertures in the mesh electrode are filled and covered with the monocrystalline ceramic layer.

DRAWINGS

These features, aspects, and advantages of the present invention will become better understood with regard to the following description, appended claims, and accompanying drawings which illustrate versions of the invention, where:

FIG. 2 is a schematic sectional side view of an embodiment of an electrostatic chuck of the present invention;

FIG. 5 is a schematic view of an apparatus suitable for forming a monocrystalline ceramic coating on a workpiece surface.

DESCRIPTION

Figure 1B:
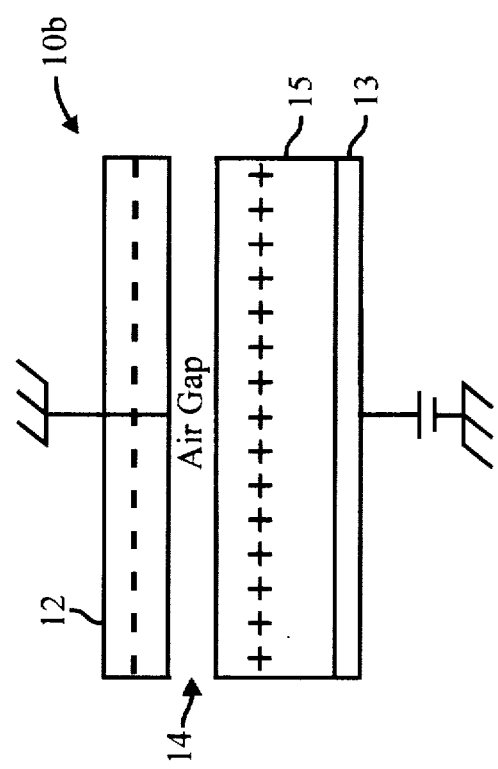
FIG. 1b (Prior Art) is a schematic view of an electrostatic chuck that operates using Johnsen-Rahbek electrostatic forces.
Figure 1A:
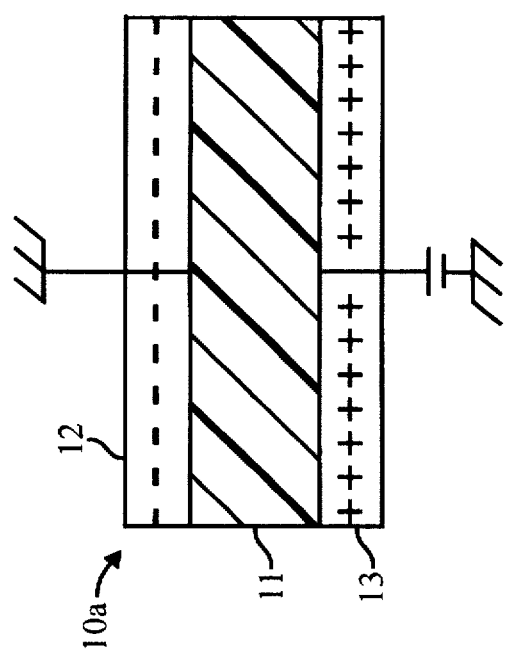
FIG. 1a (Prior Art) is a schematic view of an electrostatic chuck that operates using coulombic electrostatic forces.

The present invention relates to a method of forming a monocrystalline ceramic structure, and is illustrated in the context of an electrostatic chuck 20 comprising a monocrystalline ceramic 28 having embedded therein one or more electrodes 30. The monocrystalline ceramic provides reduced particle generation during processing of substrates held on the chuck, and also provides excellent erosion resistance in highly erosive halogen-containing plasma environments. Although use of the present invention is illustrated by an electrostatic chuck 20, the invention can also be used to fabricate other structures, such as monocrystalline ceramic structures and coatings for electronic, magnetic, and mechanical applications, as apparent to those skilled in the art, without deviating from the scope of the invention. Thus the present invention should not be limited to the illustrative embodiments of the invention described herein.

With reference to FIGS. 2, an electrostatic chuck 20 fabricated using the principles of the present invention comprises at beast one mesh electrode 30 on an underlying dielectric layer 25, the mesh electrode having predefined apertures 35 therethrough. The underlying dielectric layer 25 can be formed from the same material as the monocrystalline ceramic 28 or can be a different ceramic material. The mesh electrode is an electrically conductive patterned electrode. The monocrystalline ceramic structure 28 covering the mesh electrode 30 comprises a layer of few (typically 10 or fewer) relatively large crystals that are substantially oriented to one another and have crystallographic planes that are substantially aligned to one another. The large crystals within the ceramic structure 28 typically have an average diameter of about 1 to about 10 cms, and more typically from about 1 to 5 cms. The oriented crystals of the monocrystalline ceramic coating 28 also have a resistivity sufficiently high to electrically insulate the mesh electrode 30. The resistivity of the monocrystalline ceramic coating 28 is preferably from about $1 \times 10^8$ to about $1 \times 10^{20} \Omega cm$, and more preferably from about $1 \times 10^{11}$ to about $1 \times 10^{13} \Omega cm$, and is tailored to provide a resistance suitable for forming a coulombic or Johnsen-Rahbek chuck.

Suitable monocrystalline ceramic coatings 28 can be fabricated from $Al_2O_3$, BeO, $SiO_2$, $Ta_2O_5$, $ZrO_2$, CaO, MgO, $TiO_2$, $BaTiO_3$, AlN, TiN, BN, $Si_3N_4$, $ZrB_2$, $TiB_2$, $VB_2$, $W_2B_3$, $LaB_6$, $MoSi_2$, $WSi_x$, or $TiSi_x$. More preferably, both the monocrystalline ceramic coating 28 and the underlying dielectric layer 25 both comprise sapphire, which is a monocrystalline form of alumina. Sapphire provides excellent chemical and erosion resistance in erosive environments, particularly halogen plasma environments.

Sapphire also provides high temperature performance exceeding 2000° C. The monocrystalline ceramic coating 28 can also be doped with suitable dopants to provide the desired electrical properties such as resistivity and dielectric breakdown strength. For example, whereas pure $Al_2O_3$ has a resistivity on the order of $1 \times 10^{14}$ ohm cm, alumina can be doped with 1 to 3 wt % titania to provide a lower resistivity on the order of $1 \times 10^{11}$ to $1 \times 10^{13}$, suitable for use in Johnsen-Rahbek electrostatic chucks. Preferably, the thickness t of the monocrystalline ceramic coating 28 is at least about three times the diameter of the apertures 35 between the patterned mesh electrode 30 to reduce spreading of the electric field from the electrode.

Preferably, the monocrystalline ceramic coating 28 further comprises integral bonding interconnects 40 that form a unitary structure with the layer of oriented crystals. The bonding interconnects 40 comprise monocrystalline material having large oriented crystals that extend through the apertures 35 in the mesh electrode 30 to bond directly to the underlying dielectric layer 25 substantially without adhesive. The integral bonding interconnects 40 comprise posts of monocrystalline material extending from the layer of crystals covering the electrode 30 and through the apertures 35 in the mesh electrode 30 to bond directly to the underlying dielectric layer 25. The posts 40 are formed when molten ceramic material is applied over the exposed surface of the mesh electrode 30. The molten material seeps into the apertures of the mesh electrode 30 and fuses with the underlying dielectric layer 25 to form a continuous and chemically bonded ceramic structure enclosing the entire mesh electrode. Preferably, the apertures in the mesh electrode 30 are sized (i) sufficiently small to allow the mesh electrode to generate a uniform electrostatic field for holding a substrate upon application of a voltage thereto, and (ii) sufficiently large to allow the bonding interconnects 40 formed therein to securely bond the monocrystalline ceramic layer 28 to the underlying dielectric layer 25. Elimination of the adhesive used to join conventional dielectric layers of electrostatic chucks 20, through use of the bonding interconnects 40, provides stable and reliable electrical properties at high operating temperatures, exceeding about 1000° C., and often exceeding 2000° C. Elimination of the adhesive also provides improved erosion resistance in highly erosive plasma environments.

Figure 3:
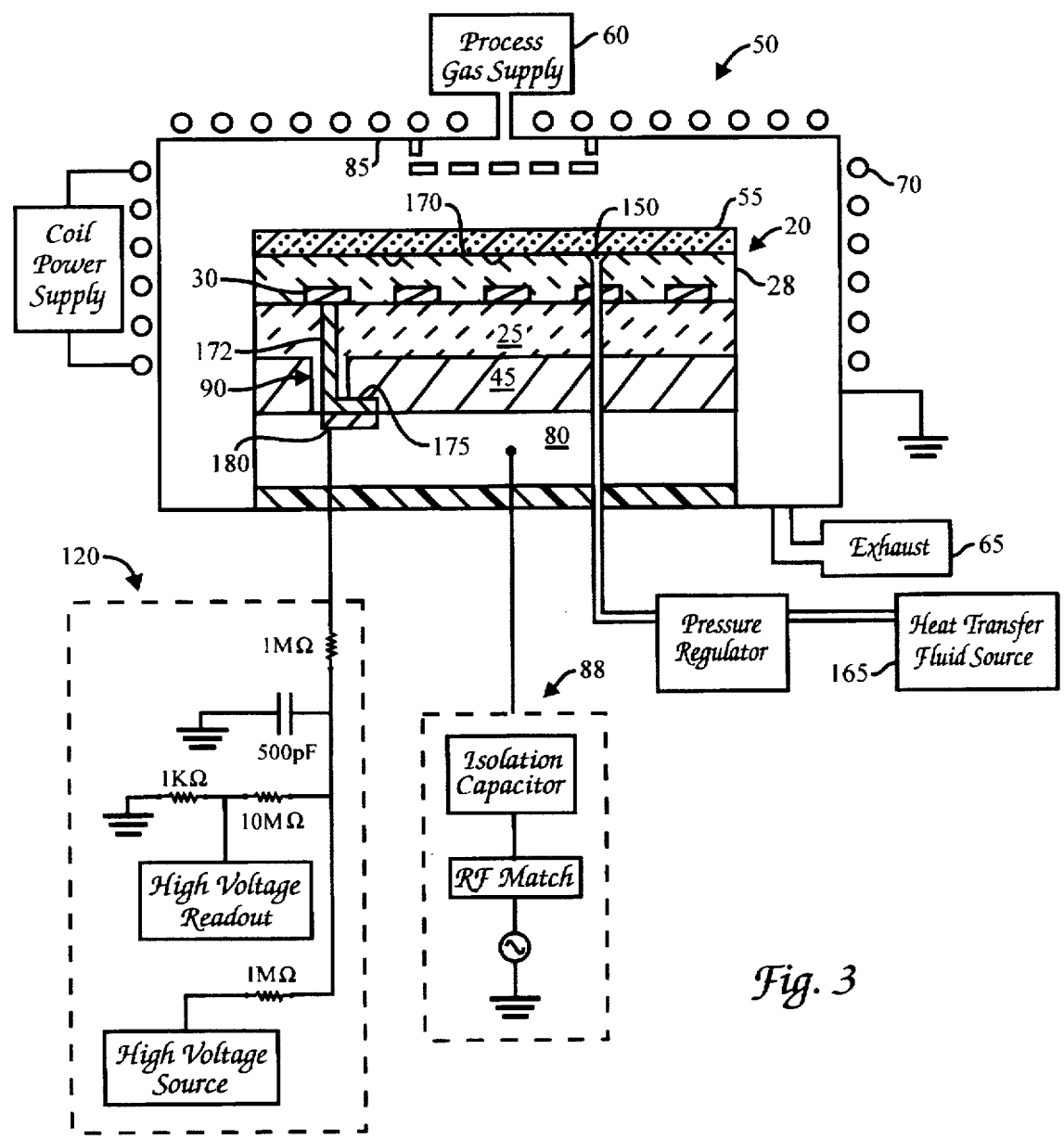
FIG. 3 is a schematic sectional side view of a process chamber comprising a monopolar chuck of the present invention.

With reference to FIG. 3, use of a chuck 20 of the present invention having a monopolar electrode 30 will be described in the context of holding semiconductor substrates 55 in a plasma process chamber 50. The chuck 20 is typically mounted on a base 45 comprising an electrically conductive material and capable of being mounted in the chamber 50. The process chamber 50 shown in FIG. 3 represents a CENTURA 5200 oxide etch chamber commercially available from Applied Materials Inc., Santa Clara, Calif., as described in commonly assigned patent application Ser. No. 07/941,507, filed on Sep. 8, 1992, which is incorporated herein by reference. The particular embodiment of the process chamber 50 is suitable for plasma processing of a semiconductor substrate 55; however, the present invention can also be used with other process chambers or processes without deviating from the scope of the invention.

The process chamber 50 typically includes a process gas supply 60 for introducing process gas into the chamber via a gas distributor 62, and a throttled exhaust 65 for exhausting gaseous byproducts from the chamber. A plasma is formed from the process gas using a plasma generator that couples an electric field into the chamber 50. The plasma generator can comprise an inductor coil 70 capable of forming an inductive electric field in the chamber when powered by a coil power supply 75. Alternatively, the chamber can include cathode and anode electrodes 80, 85, that are used to generate a capacitive electric field in the process chamber 50 when powered by an RF power supply 88. The capacitive electric field is perpendicular to the plane of the substrate 55, and accelerates inductively formed plasma species toward the substrate. The frequency of the RF voltage applied to the process electrodes, and/or the inductor coil 70, is typically from about 50 Khz to about 60 MHZ, and more typically about 13.56 MHZ; and the RF voltage applied to the coil or process electrodes is typically from about 100to about 5000 Watts.

To operate the chuck 20, the process chamber 50 is evacuated and maintained at a subatmospheric pressure. A robot arm (not shown) transports a substrate 55 from a load-lock transfer chamber through a slit valve and into the chamber. The robot arm places the substrate 55 on the tips of lift fingers (not shown) that are elevated by the pneumatic lift mechanism to extend about 2 to 5 centimeters above the surface of the chuck 20. The pneumatic mechanism, under the control of a computer system, lowers the substrate 55 onto the chuck 20. After the substrate 55 is placed on the chuck 20, the electrode 30 of the chuck is electrically biased with respect to the substrate by the chuck voltage supply 120.

Preferably, the electrostatic chuck 20 includes heat transfer gas openings or conduits 150 extending therethrough. A gas supply channel 155 supplies heat transfer gas to the conduits 150 from a heat transfer gas source 165. The heat transfer gas flows through the gas supply channel 155 in the chuck 20 to exit through the conduits 150 on the top surface 170 of the chuck 20 to regulate the temperature of the substrate 55 held on the chuck 20. Typically, an inert gas such as helium or argon is supplied at a pressure of about 5 to 30 Torr. The substrate 55 held on the chuck 20 covers and seals the peripheral edges of the ceramic coating 28 to reduce leakage of heat transfer gas. The heat transfer gas below the substrate 55 can heat or cool the substrate to maintain the substrate at constant temperatures.

After completion of processing, the pneumatic lifting apparatus raises the substrate 55 and allow the substrate to be removed by the robotic arm. Before raising the substrate 55, the substrate is electrically decoupled or dechucked from the chuck 20, by dissipating the residual electrical charges holding the substrate onto the chuck after the voltage to the electrode 30 is turned off. Typically, the chucking voltage supply 120 is turned off, and the chuck electrode 30 and substrate 55 are both connected to ground to remove the charges accumulated in the chuck electrode and in the substrate during application of voltage to the chuck 20. The substrate 55 can be electrically grounded by connecting the electrode 30 to ground or by forming a plasma at a reduced power level over the substrate 55 to provide an electrically conductive path of charge from the substrate to the grounded walls of the chamber 50.

Figure 4:
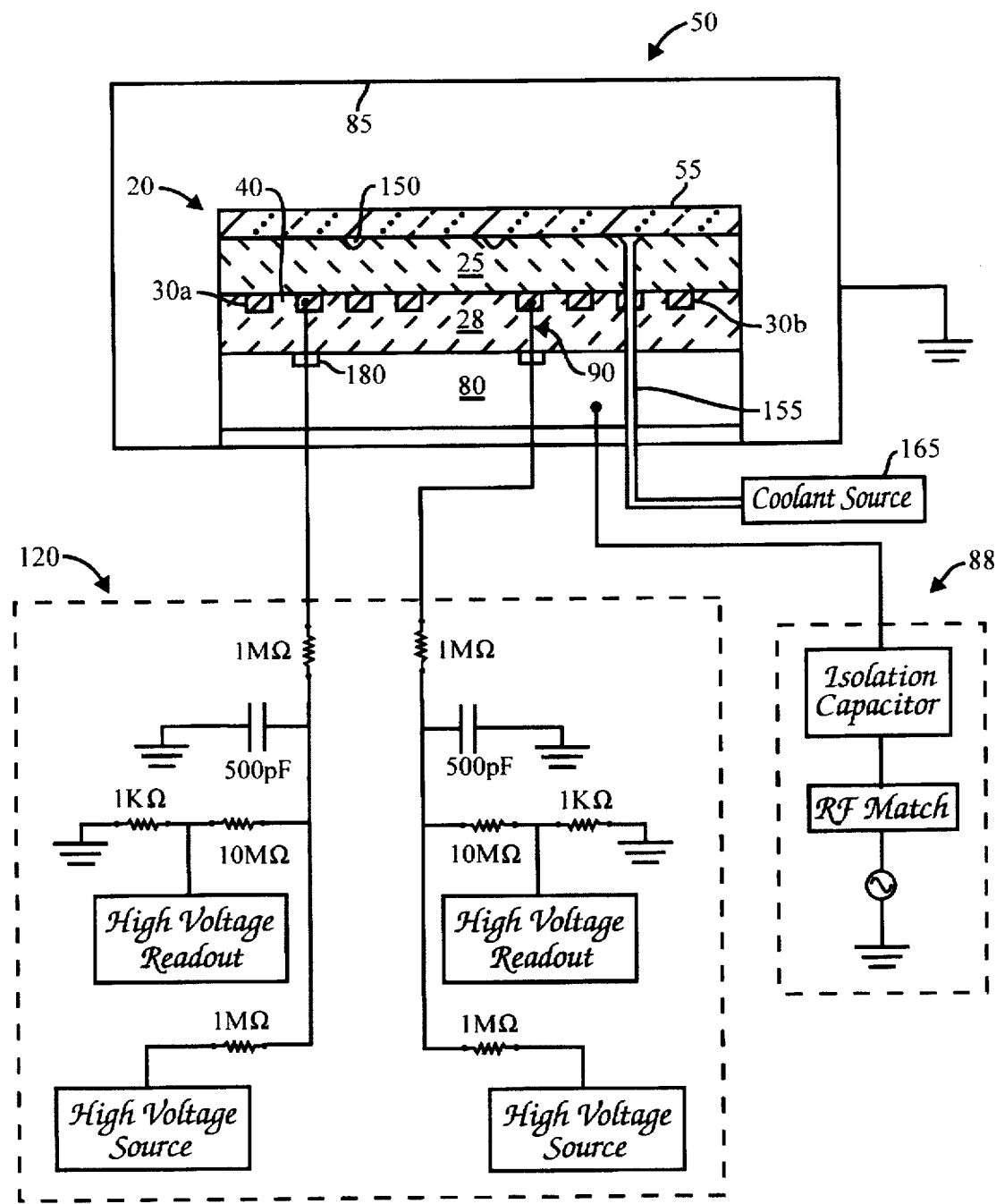
FIG. 4 is a schematic sectional side view of a process chamber comprising a bipolar chuck of the present invention.

In the embodiment shown in FIG. 3, the mesh electrode 30 of the chuck 20 is a monopolar electrode. During operation of the monopolar electrode, a voltage applied to the mesh electrode 30 causes electrostatic charge to accumulate in the electrode or in the ceramic coating 28 covering the electrode. The plasma in the chamber 50 provides electrically charged species having opposing polarity which accumulate in the substrate 55. The accumulated opposing electrostatic charges result in an attractive electrostatic force that electrostatically holds the substrate 55 to the chuck 20. The electrode can also comprise bipolar electrodes 30a, 30b (as shown in FIG. 4) that comprises at least two substantially coplanar electrodes that generate substantially equivalent electrostatic clamping forces. The bipolar electrodes 30a, 30b can form opposing semicircles, or inner and outer rings of electrodes with electrical isolation voids therebetween. The bipolar electrodes 30a, 30b operates by application of a differential electrical voltage that maintains each electrode at a differential electric potential. The differential electric potential induces electrostatic charges in the substrate 55 that electrostatically hold the substrate to the chuck 20.

Electrical connectors 90 are used to electrically connect the monopolar electrode 30, or the bipolar electrodes 30a, 30b, to the voltage supply 120. Each electrical connector 90 comprises an (i) electrical lead 172 that extends through the bore in the base 45, and (ii) an electrical contact 175. Typically, the length of the electrical lead 170 is from about 10 mm to about 50 mm, and the width of the electrical lead is from about 2 mm to about 10 mm. Preferably, the electrical contact 175 is disk-shaped with an exposed area sized to directly contact and electrically engage a voltage supply terminal 180, the area preferably being from about 50 to about 400 sq ram.

The mesh electrode 30 typically comprises a layer of a metal such as copper, nickel, chromium, aluminum, molybdenum, and combinations thereof; and more preferably comprises a refractory metal having a melting point of at least about 2200° C. to facilitate fabrication of the monocrystalline coating on the electrode. Typically, the thickness of the mesh electrode 30 is from about 1 μm to about 100 μm, and more typically from 1 μm to 50 μm. For a substrate 55 having a diameter of 200 to 300mm (6 to 8 inches), the electrode 30 typically covers a total area of about 50 to about 250 sq. min. The apertures 35 in the mesh electrode 30 are sized (i) sufficiently small to allow the mesh electrode to generate a uniform electrostatic field for holding the substrate 55 upon application of a voltage thereto, and (ii) sufficiently large to allow the bonding interconnects 40 formed therein to securely bond the monocrystalline layer to the underlying dielectric layer 25. The bonding interconnects 40 of the monocrystalline ceramic 28 are formed when molten ceramic material is applied over the exposed surface of the electrode 30, and seeps into the apertures of the electrode mesh to fuse with the underlying dielectric layer 25.

Several different methods can be used to form the mesh electrode 30 on the underlying dielectric layer 25. For example, a patterned mesh electrode 30 can be formed from a foil of metal using conventional bonding, stamping, or pressing methods. Alternatively, strips of metal wire can be joined together in an interconnected pattern to form a mesh of electrically conductive wire. In yet another method, a plate of electrically conductive material, such as a thin sheet of metal, is etched to form the desired mesh electrode pattern 30, using conventional etching methods. In this method, a patterned layer of resist is formed on the electrode, and the metal between the resist features is etched. Alternatively, a patterned resist layer can be formed on a dielectric layer 2.5, and metal deposited between the resist features (for example, by electroplating or sputtering) to form a mesh electrode structure 30. Suitable resist materials include "RISTON" fabricated by DuPont de Nemours Chemical Co, and conventional photolithographic methods are described in *Silicon Processing for the VLSI Era, Volume 1: Process Technology*, Chapters 12, 13, and 14, by Stanley Wolf and Richard N. Tauber, Lattice Press, Calif. (1986), which is incorporated herein by reference.

The mesh electrode 30 is then attached or bonded to a dielectric layer 25, such as a polycrystalline or monocrystalline ceramic dielectric layer. Suitable ceramic materials include those described above, and most preferably, the dielectric layer 25 is also fabricated from a monocrystalline ceramic layer to provide optimal chemical compatibility and strong bonding with the monocrystalline ceramic coating 28 covering the mesh electrode 30. The resistivity of the dielectric layer 25 should be sufficiently low to allow rapid electrostatic charge accumulation and dissipation to provide rapid response times, and sufficiently high to prevent excessive leakage of the voltage applied to the electrodes 30. Typically, the dielectric layer 25 has a resistivity of from about $10^8$ Ωcm to about $10^{20}$ Ωcm, and a dielectric constant of at least about 2. Preferably, the dielectric breakdown strength is at least about 100 volts/rail, and more typically from 1000 to 10,000 volts/mil. A suitable thickness of the dielectric layer 25 is typically about 10 to about 500 μm.

Instead of forming the electrode 30 as a separate metal structure, the electrode can also be fabricated by etching a layer of metal deposited on a dielectric layer 25. In this method, a ceramic material is shaped in a mold and sintered to form a polycrystalline ceramic disc or wafer. An electrode 30 is then formed on the surface of the polycrystalline ceramic wafer, by depositing a metal layer using conventional PVD, CVD, or solution deposition methods, such as for example metal CVD or sputtering. Conventional etching methods are used to etch the deposited metal into the desired mesh electrode configuration.

The mesh electrode 30 can also be formed on a dielectric layer 25 comprising a wafer of monocrystalline ceramic material cut from a column of monocrystalline ceramic grown by conventional methods. The mesh electrode 30 is formed or deposited on the surface of the monocrystalline ceramic wafer. Preferably, the crystalline lattice structure of the ceramic wafer is altered in a predefined pattern to form a conductive electrode pattern on the crystal structure. In this method, lattice defects are induced in the monocrystalline ceramic in a predefined pattern corresponding to the mesh electrode 30. Suitable methods include laser induced lattice damage, in which a laser beam, such as a Nd YAG having an intensity of $10^8$ Watts/cm$^2$, scanned across the monocrystalline ceramic to induce electrically conducting lattice defects in the exposed portions of the monocrystalline ceramic. The lattice defects typically comprise dislocations, which occur when atoms are moved from their initial crystalline positions to interstitial or other lattice sites.

In yet another method, the mesh electrode is formed by doping the underlying dielectric layer 25, or the monocrystalline ceramic structure 28, with suitable dopants to provide the desired electrical properties such as resistivity and dielectric breakdown strength. For example, a first monocrystalline ceramic layer that serves as the dielectric layer 25 can be doped with 1 to 10 wt % titania, in a conductive pattern suitable for use as an electrode. Conventional photolithographic and ion implantation methods can be used to form a patterned layer of dopant on the first sapphire layer. Thereafter, a second monocrystalline ceramic layer is formed on the electrode using the process of the present invention. Because the first and second monocrystalline ceramic layers and the electrode are all formed from the same material, the resultant chuck has high chemical and physical compatibility and reduced thermal expansion stresses.

After forming the mesh electrode 30 on the underlying dielectric layer 25, the monocrystalline ceramic layer 28 comprising the integral bonding interconnects 40 is formed over the mesh electrode. A preferred method of growing the monocrystalline ceramic layer 28 uses the crystal growth apparatus schematically shown in FIG. 5. In this method, the electrode 30 is attached to the underlying dielectric layer 25 and the monocrystalline ceramic layer 28 is formed over the electrode 30. The electrode 30 can be physically bonded to the dielectric layer 25, as described above. Alternatively, the electrode 30 is held to the underlying dielectric layer 25 using electrostatic forces. In the latter method, a conductive plate 200 is held on one side of the dielectric layer 25, and the electrode 30 is held on the other side, as shown in FIG. 6. Upon application of a voltage to the conductive plate 200, a capacitively coupled electric field electrostatically holds the electrode 30 to the other side of the dielectric layer 25. This arrangement is preferred because it allows forming of the bonding interconnects 40 directly on the electrode 30 without any intervening layers between the electrode 30 and the dielectric layer 25 and without the use of holding clamps for holding the electrode 30 to the dielectric layer 25.

As shown in FIG. 5, the crystal growth apparatus comprises a melt reservoir 205 for melting a ceramic material for forming a molten ceramic. The melt reservoir 205 is surrounded by ceramic fiber insulation 210, and includes a conventional heater 215, such as NICHROME wire, wrapped around the melt reservoir. The reservoir 205 is typically made of a corrosion resistant material capable of withstanding the high melting temperatures of the ceramic material, such as molybdenum, which has a melting point of 2617° C. Typical melting temperatures for such ceramic materials often exceed 1000° C., for example, the melting or softening temperature of alumina being 2015° C., of silicon dioxide being from 1200° C. to 1700° C., and of titanium dioxide being 1840° C.

A rigid capillary tube 220 is positioned in the molten ceramic of the melt reservoir 205. The diameter of the capillary tube 220 is selected based on the capillary surface tension forces of the particular ceramic material melted in the reservoir 205. A typical diameter of the tube 220 is from about 0.2 to about 2 mm. The rigid capillary tube 220 is self-filling due to the capillary forces operating in the tube that draws molten ceramic material up the length of the tube for feeding a molten ceramic layer onto a workpiece surface 223, such as an exposed surface of one or more electrodes.

The capillary tube 220 comprises an inlet 225 immersed in the molten ceramic in the reservoir 205, and an outlet 230 adjacent to the workpiece surface 223, for example, the exposed surface of the electrode 30. The outlet 230 has (1) a leading edge 235 having a first height and a seeding surface 240, and (2) a trailing edge 245 having a second height smaller than the first height. The thickness t of the monocrystalline ceramic layer 25 deposited on the workpiece surface 223 is controlled by the difference in height of the leading and trailing edges 235, 245 of the outlet 230, i.e., the difference in first and second heights. The outlet 230 of the capillary tube 220 is moved across the workpiece surface 223 in a direction such that leading edge 235 of the capillary tube moves ahead of the trailing edge 245, to deposit on the workpiece surface a layer of molten ceramic layer. The molten ceramic layer is drawn through the capillary tube 220 by capillary forces and is seeded by the seeding surface 240 of the leading edge 235 to form a monocrystalline ceramic layer 28 on the workpiece surface 223.

The bonding interconnects 40 are formed during deposition of the molten ceramic layer on the workpiece surface 223. For example, on the exposed surface of the electrode 30 of the chuck 20, the molten ceramic material flows thorough the apertures in the mesh electrode 30 to bond directly to junction regions on the underlying dielectric layer that lying immediately below the open apertures of the mesh electrode 30. The bonding interconnects 40 are typically shaped as posts having a diameter or width defined by the sizes of the apertures in the mesh electrode 30. The molten ceramic material seeps or flows into the apertures of the mesh and fuses with the underlying dielectric layer 25 to form a continuous and chemically bonded ceramic structure enclosing the entire electrode 30. The resultant structure eliminates the use of adhesives for bonding the underlying dielectric layer 25 below the electrode 30 to the monocrystalline ceramic layer covering the electrode, to provide enhanced high temperature capability, and reduced erosion of the chuck 20.

Preferably, the temperature of the capillary tube 220 and the workpiece surface 223 is maintained uniform by a temperature control system 250, which is used to continuously heat the capillary tube and workpiece surface during deposition of the monocrystalline ceramic layers 28. Heating of the workpiece surface 223 allows the coplanar ceramic layers to merge and flow into one another to form a continuous ceramic layer covering the substantially the entire workpiece surface. The temperature control system 250 comprises a heat shield 255, a heating and/or a cooling system 260, and a temperature controller 265. The heating and/or cooling systems 260 are suitable for maintaining substantially uniform temperatures. The heat shield 255 can comprise a cylinder of ceramic insulation 210 surrounding the tube 220, and a heat shield box surrounding the workpiece surface 223, suitable ceramic insulation including ZIRCAR fibers, commercially available from ZIRCAR Company. Preferably, the heat coil in the ceramic insulator is connected to a closed loop temperature controller 265 to control the temperature of the tube 220 and workpiece surface 223. Cooling tubes that contain a heat transfer fluid, such as water or helium gas, can also be provided around the capillary tube 220 and the workpiece surface 223 to provide a source of rapid heat dissipation (not shown). The rate of growth of the monocrystalline ceramic layer 25 is maximized by reducing heat loss and minimizing thermal shocking of the deposited layer through use of the temperature control system.

The capillary tube 220 is preferably fabricated from a material that uniformly wets the molten ceramic material with a contact angle of less than about 90°. Also, because the monocrystalline ceramic cannot be contaminated by dissolution of capillary tube material into the melt, a high melting temperature and chemically stable material is used to form the capillary tube 220. A suitable high temperature material is molybdenum. Molybdenum also uniformly wets molten alumina, and has a low reactivity and high chemical compatibility with molten alumina.

The larger the height of the capillary tube 220, the less the mechanical instabilities and perturbations formed in the molten ceramic layer deposited on the workpiece surface 223. A tall capillary tube 220 also reduces the variability in temperature at the solidification interface with the decreasing melt level in the crucible. The tall capillary tube 220 further reduces variations in surface tension forces across the liquid film at the outlet 230 of the capillary tube;. However, the maximum permissible height of the capillary tube 220 depends on the surface tension and density of the molten ceramic material in the capillary tube. Most ceramic materials have a high surface tension, a low contact angle, and low density, which provides relatively tall capillary rise. A suitable height of the capillary tube for molten alumina in a molybdenum capillary tube 220 is at least about 25 mm, and more preferably at least about 50 mm above the melt surface in the melt reservoir 205.

The outlet 230 of the capillary tube 220 comprises a leading edge 235 having a seeding surface 240. The seeding surface 240 seeds or nucleates growth of a monocrystalline ceramic layer 28 from the molten ceramic material. The seeding surface 240 typically comprises a straight edge of a crystal of the same material as the monocrystalline ceramic material. Because the seed crystal has the same crystallographic structure as the crystalline form of the molten ceramic material, it serves as a seeding or nucleating surface that initiates growth of a monocrystalline ceramic layer 28 on the workpiece surface 223.

The outlet 230 of the capillary tube 220 does not need to match the shape of the area to be covered by the monocrystalline ceramic layer 28, because the outlet deposits a ribbon of molten ceramic material on the workpiece surface 223 as the outlet moves across the workpiece surface or vice versa. The workpiece surface 223 is continuously heated during deposition of multiple ribbons of ceramic material, to a temperature close to the melting temperature of the ceramic material deposited thereon, causing the ribbons to flow into one another to form a ceramic layer that is continuous and uniform across the workpiece surface. The width of each ribbon of molten ceramic corresponds to the width w of the outlet 230, and the height t of the ribbons corresponds to the difference in height of the leading and trailing edges 235, 245 that define the outlet opening 230.

The capillary feed tube 220 and workpiece surface 223 are moved relative to one another to deposit a uniform layer of molten ceramic material on the electrode 30. Typically, the rate of movement of the molten ceramic material through the capillary tube 220 is from about 10 to 100cm/min; and the rate of movement of the outlet 230 of the capillary tube is adjusted accordingly to provide the desired thickness t of the monocrystalline ceramic material on the workpiece surface 223. Preferably, the workpiece surface 223 is moved across the outlet 230 of the capillary tube 220 at a rate sufficiently low to provide a melt interface that is mechanically stable. Since the capillary tube 220 is fixed in the melt reservoir 205, the top of the molten ceramic material in the tube 220 and the crystal growth interface are both relatively stationary with respect to the melt reservoir. Alternatively, the outlet 230 of the capillary tube 220 along with the surrounding heat shielding 255, is moved across the workpiece surface 223. A mechanical robotic guidance system can be used to move the outlet 230 of the capillary tube 220 and workpiece surface 223 relative to one another. A conventional robotic mechanism programmed using C++ or programming assembly language in a computer control system, can be used to move the tube 220 at predefined rates of travel to provide the desired thickness and shape of the monocrystalline dielectric layer 25. Also, the robotic assembly can be programmed to deposit multiple layers of monocrystalline ceramic material, stacked onto top of one another, on the workpiece surface 223.

The present method of forming a monocrystalline ceramic layer 28 on a surface of a workpiece 223, such as the exposed surface of an electrode 30 of a chuck 20, provides significant improvement over prior methods in which the single crystal of ceramic is pulled from a ceramic melt. The process is continuous, stable, and allows uninterrupted deposition and growth of the monocrystalline ceramic layer 28 on the workpiece surface 223. The remote location of the melt interface with respect to the ceramic melt level, damps thermal and mechanical perturbations in the ceramic melt, before they reach the top of the capillary tube 220 and the crystal growth interface.

Furthermore, conventional processes produce a single bulk crystalline structure that is difficult to bond to other structures, particularly wafers cut from the bulk ceramic material. In contrast, the present method allows forming one or more layers of monocrystalline ceramic having bonding interconnects 40 that are bonded directly to the ceramic layers 28, or to a polycrystalline ceramic layer, substantially without the use of adhesives. The monocrystalline ceramic layer 28 also reduces particulate and contaminant generation, and allows operation of the chuck 20 at higher operating temperatures, and with more reliability.

While the present invention has been described in considerable detail with reference to certain preferred versions, many other versions should be apparent to those skilled in the art. Therefore, the spirit and scope of the appended claims should not be limited to the description of the preferred versions contained herein.

What is claimed is:

1. An erosion resistant electrostatic chuck for holding substrates in a process chamber, the chuck comprising:
    (a) at least one mesh electrode on an underlying dielectric layer, the mesh electrode having apertures therethrough; and
    (b) a monocrystalline ceramic covering the mesh electrode, the monocrystalline ceramic comprising:
        (i) a layer of large crystals substantially oriented to one another, the layer of crystals having a resistivity sufficiently high to electrically insulate the mesh electrode; and
        (ii) integral bonding interconnects that form a unitary structure with the layer of large crystals, the bonding interconnects extending through the apertures in the mesh electrode to bond directly to the underlying dielectric layer.

2. The electrostatic chuck of claim 1, wherein the monocrystalline ceramic is bonded directly to the underlying dielectric layer substantially without adhesive.

3. The electrostatic chuck of claim 1, wherein the apertures in the mesh electrode are sized (i) sufficiently small to allow the mesh electrode to generate a uniform electrostatic field for holding the substrate upon application of a voltage to the electrode, and (ii) sufficiently large to allow the bonding interconnects formed therein to securely bond the monocrystalline layer to the underlying dielectric layer.

4. The electrostatic chuck of claim 1, wherein the monocrystalline ceramic coating comprises $Al_2O_3$, BeO, $SiO_2$, $Ta_2O_5$, $ZrO_2$, CaO, MgO, $TiO_2$, $BaTiO_3$, AlN, TiN, BN, $Si_3N_4$, $ZrB_2$, $TiB_2$, $VB_2$, $W_2B_3$, $LaB_6$, $MoSi_2$, $WSi_x$, or $TiSi_x$.

5. The electrostatic chuck of claim 4, wherein the monocrystalline ceramic coating comprises sapphire.

6. The electrostatic chuck of claim 5, wherein underlying dielectric layer comprises sapphire.

7. The electrostatic chuck of claim 4, wherein the electrode comprises a refractory metal having a melting point of at least about 2200° C.

8. The electrostatic chuck of claim 1, wherein the monocrystalline ceramic coating comprises at least one of the following characteristics:
    (1) a dielectric breakdown strength of at least about 1000 volts/mil;
    (2) a resistivity of from about $10^{13}$ Ωcm to about $10^{20}$ Ωcm; or
    (3) a dielectric constant of at least about 2.

9. A process chamber comprising the electrostatic chuck of claim 1.

10. A method of forming a monocrystalline ceramic layer on a workpiece surface, the method comprising the steps of:
    (a) melting a ceramic in a melt reservoir to form a molten ceramic;
    (b) positioning a capillary tube in the molten ceramic of the melt reservoir, the capillary tube comprising:
        (i) an inlet in the reservoir; and
        (ii) an outlet adjacent to the workpiece surface, the outlet comprising (1) a leading edge having a first height and a seeding surface, and (2) a trailing edge having a second height smaller than the first height;
    (c) moving the outlet of the capillary tube across the workpiece surface in a direction such that leading edge of the capillary tube moves ahead of the trailing edge, to deposit on the workpiece surface, a molten ceramic layer (i) drawn through the capillary tube, (ii) seeded by the seeding surface of the leading edge, and (iii) having a thickness t substantially controlled by the difference in first and second heights; and
    (d) cooling the seeded molten ceramic layer to form a monocrystalline ceramic layer comprising large crystals substantially oriented to one another.

11. The method of claim 10, wherein the seeding surface on the leading edge comprises a seed crystal of the monocrystalline ceramic.

12. The method of claim 10, wherein the workpiece surface is continuously heated during deposition of the monocrystalline ceramic layer.

13. The method of claim 10, wherein the capillary tube comprises a diameter of from about 0.2 to 2 mm.

14. The method of claim 10, wherein the workpiece surface comprises:
    (i) a dielectric layer formed by sintering a ceramic material to form a polycrystalline ceramic wafer; and
    (ii) an electrode on the surface of the polycrystalline ceramic wafer.

15. The method of claim 10, wherein the workpiece surface is formed by the steps of:
    (i) forming a substantially monocrystalline ceramic;
    (ii) cutting a wafer of the substantially monocrystalline ceramic to form a dielectric layer; and
    (iii) attaching an electrode on the surface of the monocrystalline ceramic wafer.

16. The method of claim 10, wherein the workpiece surface comprises a mesh electrode having apertures, the mesh electrode formed on an underlying dielectric layer by at least one of the following steps:
    (i) etching a metal foil to form a mesh electrode and attaching the mesh electrode to the dielectric layer;
    (ii) depositing a metal layer on the dielectric layer and etching the deposited metal layer to form the mesh electrode; or
    (iii) forming a pattern of resist features on the dielectric layer and depositing metal between the resist features to form the mesh electrode.

17. The method of claim 16, wherein the thickness of the monocrystalline ceramic is at least about three times the diameter of the apertures in the mesh electrode to substantially preclude spreading of an electric field around the electrode upon application of a voltage to the electrode.

18. An electrostatic chuck formed by the method of claim 16.

19. A method for fabricating an erosion resistant electrostatic chuck for holding a substrate thereon, the method comprising the steps of:
    (a) forming a mesh electrode on a dielectric layer, the mesh electrode having an exposed surface and apertures therethrough;

(b) melting a ceramic in a melt reservoir to form a molten ceramic;

(c) positioning a capillary tube in the melt reservoir, the capillary tube comprising:
(i) an inlet immersed in the molten ceramic of the melt reservoir, and
(ii) an outlet adjacent to the exposed surface of the electrode, the outlet comprising (1) a leading edge having a first height and a seeding surface, and (2) a trailing edge having a second height smaller than the first height;

(d) moving the outlet of the capillary tube across the exposed surface of the electrode in a direction such that leading edge of the capillary tube moves ahead of the trailing edge, to deposit on the exposed surface, a molten ceramic layer (i) drawn through the capillary tube, (ii) seeded by the seeding surface of the leading edge, and (iii) having a thickness t substantially controlled by the difference in first and second heights; and (e) cooling the seeded molten ceramic layer to form a monocrystalline ceramic layer comprising large crystals substantially oriented to one another.

20. The method of claim 19, wherein the workpiece surface is continuously heated during deposition of the monocrystalline ceramic layer.

21. The method of claim 19, wherein the seeding surface on the leading edge of the capillary tube outlet comprises a seed crystal of monocrystalline ceramic.

22. The method of claim 19, wherein the capillary tube comprises a diameter of from about 0.2 to 2 mm.

23. The method of claim 19, wherein step (a) comprises attaching a mesh electrode to the dielectric layer using electrostatic forces by (i) holding a conductive plate on one side of the dielectric layer, and (ii) positioning the mesh electrode on the other side, and (iii) applying a voltage to the conductive plate to generate a capacitively coupled electric field that electrostatically holds the electrode to the other side of the dielectric layer.

24. The method of claim 19, wherein step (a) comprises the steps of:
(i) forming the first dielectric layer by sintering a ceramic material to form a polycrystalline ceramic wafer; and
(ii) forming an electrode on the polycrystalline ceramic wafer.

25. The method of claim 19, wherein step (a) comprises the steps of:
(i) growing a substantially monocrystalline ceramic;
(ii) cutting a wafer of the substantially monocrystalline ceramic to form the dielectric layer; and
(iii) forming an electrode on the surface of the dielectric layer.

26. The method of claim 19, wherein in step (a) the electrode mesh is formed by at least one of the following steps:
(i) etching a metal foil to form the mesh electrode and attaching the mesh electrode on the dielectric layer;
(ii) depositing a metal layer on the dielectric layer and etching the deposited metal layer to form the mesh electrode; or
(iii) forming a pattern of resist features on the dielectric layer and depositing metal between the resist features to form the electrode.

27. The method of claim 19, wherein the thickness t of the monocrystalline ceramic is at least about three times the diameter of apertures in the mesh electrode to substantially preclude spreading of electric field around the electrode upon application of a voltage to the electrode.

28. An electrostatic chuck comprising a monocrystalline ceramic layer formed by the method of claim 19.

29. An electrostatic chuck for holding substrates in a process chamber, the chuck comprising:
(a) a first monocrystalline ceramic layer comprising at least one mesh electrode thereon, the mesh electrode having apertures therethrough; and
(b) a second monocrystalline ceramic layer covering the mesh electrode, the second monocrystalline ceramic layer comprising integral bonding interconnects that extend through the apertures in the mesh electrode to bond directly to the first monocrystalline ceramic layer, wherein the first and second monocrystalline ceramic layers comprise large crystals substantially oriented to one another, the crystals having a resistivity sufficiently high to electrically insulate the mesh electrode.

30. The electrostatic chuck of claim 29, wherein the monocrystalline ceramic layer is bonded directly to the underlying dielectric layer substantially without adhesive.

31. The electrostatic chuck of claim 29, wherein the electrode comprises a pattern of lattice defects induced in the first monocrystalline ceramic layer.

32. The electrostatic chuck of claim 29, wherein the mesh electrode comprise a pattern of dopant in the first monocrystalline ceramic layer.

33. The electrostatic chuck of claim 29, wherein the apertures in the mesh electrode are sized (i) sufficiently small to allow the mesh electrode to generate a uniform electrostatic field for holding the substrate upon application of a voltage to the electrode, and (ii) sufficiently large to allow the bonding interconnects formed therein to securely bond the second monocrystalline layer to the first monocrystalline ceramic layer.

34. The electrostatic chuck of claim 29, wherein the first and second monocrystalline ceramic layers comprise $Al_2O_3$, BeO, $SiO_2$, $Ta_2O_5$, $ZrO_2$, CaO, MgO, $TiO_2$, $BaTiO_3$, AlN, TiN, BN, $Si_3N_4$, $ZrB_2$, $TiB_2$, $VB_2$, $W_2B_3$, $LaB_6$, $MoSi_2$, $WSi_x$, or $TiSi_x$.

35. The electrostatic chuck of claim 29, wherein the first and second monocrystalline ceramic layers comprises sapphire.

36. A process chamber comprising the electrostatic chuck of claim 29.

37. A method for fabricating an electrostatic chuck for holding a substrate thereon, the method comprising the steps of:
(a) forming a first monocrystalline ceramic layer;
(b) forming a mesh electrode on a first monocrystalline ceramic layer, the mesh electrode having an exposed surface and apertures therethrough;
(c) melting a ceramic in a melt reservoir to form a molten ceramic;
(d) positioning a capillary tube in the melt reservoir, the capillary tube comprising:
(i) an inlet immersed in the molten ceramic of the melt reservoir, and
(ii) an outlet adjacent to the exposed surface of the mesh electrode, the outlet comprising (1) a leading edge having a first height and a seeding surface, and (2) a trailing edge having a second height smaller than the first height;
(e) moving the outlet of the capillary tube across the exposed surface of the electrode in a direction such that leading edge of the capillary tube moves ahead of the trailing edge, to deposit on the exposed surface, a molten ceramic layer (i) drawn through the capillary tube, (ii) seeded by the seeding surface of the leading edge, and (iii) having a thickness t substantially controlled by the difference in first and second heights; and (f) cooling the seeded molten ceramic layer to form a monocrystalline ceramic layer comprising large crystals substantially oriented to one another.

38. The method of claim 37, wherein the mesh electrode is fabricated by inducing a pattern of lattice damage in the first monocrystalline ceramic layer.

39. The method of claim 37, wherein the mesh electrode is formed by doping the monocrystalline ceramic layer with a pattern of dopants.

40. The method of claim 37, wherein the workpiece surface is continuously heated during deposition of the monocrystalline ceramic layer.

41. The method of claim 37, wherein the seeding surface on the leading edge of the capillary tube outlet comprises a seed crystal of monocrystalline ceramic.

42. The method of claim 37, wherein the thickness t of the second monocrystalline ceramic is at least about three times the diameter of apertures in the mesh electrode to substantially preclude spreading of electric field around the electrode upon application of a voltage to the electrode.

43. An electrostatic chuck formed by the method of claim 37.

44. An electrostatic chuck for holding a substrate in a process chamber, the chuck comprising:

(a) a monocrystalline ceramic comprising large crystals substantially oriented to one another;

(b) an electrode embedded in the monocrystalline ceramic for electrostatically holding the substrate upon application of a voltage to the electrode; and (c) an electrical connector for supplying a voltage to the electrode, the electrical connector extending through the monocrystalline ceramic.

45. The electrostatic chuck of claim 44 wherein the monocrystalline ceramic comprises bonding interconnects that extend through apertures in the electrode.

46. The electrostatic chuck of claim 45 wherein the apertures are sized sufficiently small to allow the electrode to electrostatically hold the substrate upon application of a voltage to the electrode, and sufficiently large to allow the bonding interconnects to securely hold the electrode in the monocrystalline ceramic.

47. The electrostatic chuck of claim 44 wherein the monocrystalline ceramic comprises one or more of $Al_2O_3$, $BeO$, $SiO_2$, $Ta_2O_5$, $ZrO_2$, $CaO$, $MgO$, $TiO_2$, $BaTiO_3$, $AlN$, $TiN$, $BN$, $Si_3N_4$, $ZrB_2$, $TiB_2$, $VB_2$, $W_2B_3$, $LaB_6$, $MoSi_2$, $WSi_x$, and $TiSi_x$.

48. The electrostatic chuck of claim 44 wherein the monocrystalline ceramic consists essentially of sapphire.

49. The electrostatic chuck of claim 48 wherein the electrode comprises a refractory metal having a melting point of at least about 2200° C.

50. The electrostatic chuck of claim 44 wherein the monocrystalline ceramic comprises a dielectric breakdown strength of at least about 1000 volts/mil.

51. A process chamber comprising the electrostatic chuck of claim 44.

52. An electrostatic chuck for holding a substrate in a process chamber, the chuck comprising:

(a) a mesh electrode having apertures therethrough;

(b) an unitary structure of monocrystalline ceramic surrounding the mesh electrode, the monocrystalline ceramic comprising large crystals substantially oriented to one another, and bonding interconnects integral to the crystals and extending through the apertures in the mesh electrode to hold the mesh electrode in the unitary structure; and (c) an electrical connector extending through the unitary structure to provide a voltage to the electrode.

53. The electrostatic chuck of claim 52 wherein the apertures in the mesh electrode are sized (i) sufficiently small to provide an electrode area that can electrostatically hold the substrate upon application of a voltage to the electrode, and (ii) sufficiently large to allow the bonding interconnects to securely hold the electrode in the unitary structure.

54. The electrostatic chuck of claim 52 wherein the monocrystalline ceramic comprises one or more of $Al_2O_3$, $BeO$, $SiO_2$, $Ta_2O_5$, $ZrO_2$, $CaO$, $MgO$, $TiO_2$, $BaTiO_3$, $AlN$, $TiN$, $BN$, $Si_3N_4$, $ZrB_2$, $TiB_2$, $VB_2$, $W_2B_3$, $LaB_6$, $MoSi_2$, $WSi_x$, and $TiSi_x$.

55. The electrostatic chuck of claim 52 wherein the monocrystalline ceramic consists essentially of sapphire.

56. The electrostatic chuck of claim 52 wherein the electrode comprises a refractory metal having a melting point of at least about 2200° C.

57. The electrostatic chuck of claim 52 wherein the monocrystalline ceramic comprises a dielectric breakdown strength of at least about 1000 volts/mil.

58. A process chamber comprising the electrostatic chuck of claim 52.

* * * * *